(12) United States Patent
Hori et al.

(10) Patent No.: US 8,309,975 B2
(45) Date of Patent: Nov. 13, 2012

(54) SEMICONDUCTOR LIGHT EMITTING ELEMENT AND SEMICONDUCTOR LIGHT EMITTING DEVICE USING THE SAME

(75) Inventors: Atsuhiro Hori, Kagoshima (JP); Hidenori Kamei, Kagoshima (JP); Syuusaku Maeda, Kagoshima (JP)

(73) Assignee: Panasonic Corporation, Osaka (JP)

( * ) Notice: Subject to any disclaimer, the term of this patent is extended or adjusted under 35 U.S.C. 154(b) by 85 days.

(21) Appl. No.: 12/739,295

(22) PCT Filed: Oct. 30, 2008

(86) PCT No.: PCT/JP2008/003118
§ 371 (c)(1),
(2), (4) Date: Apr. 22, 2010

(87) PCT Pub. No.: WO2009/057311
PCT Pub. Date: May 7, 2009

(65) Prior Publication Data
US 2010/0258837 A1    Oct. 14, 2010

(30) Foreign Application Priority Data
Nov. 1, 2007   (JP) .................................. 2007-285000

(51) Int. Cl.
*H01L 33/00* (2010.01)
(52) U.S. Cl. ................ 257/82; 257/88; 257/93; 257/99; 257/503
(58) Field of Classification Search .................. 362/545; 257/81, 82, 88, 93, 99, 503, 781, 700, 777, 257/758, 680, E33.026
See application file for complete search history.

(56) References Cited

U.S. PATENT DOCUMENTS

| | | | |
|---|---|---|---|
| 7,569,865 B2 * | 8/2009 | Lee et al. ........................ | 257/99 |
| 2003/0230754 A1 | 12/2003 | Steigerwald et al. | |
| 2004/0124422 A1 | 7/2004 | Sakamoto et al. | |
| 2006/0001035 A1 | 1/2006 | Suchiro et al. | |
| 2006/0060878 A1 * | 3/2006 | Kim et al. ........................ | 257/99 |
| 2006/0131708 A1 * | 6/2006 | Ng et al. ........................ | 257/678 |
| 2006/0220043 A1 | 10/2006 | Kim et al. | |
| 2007/0085095 A1 | 4/2007 | Ko et al. | |
| 2007/0228388 A1 | 10/2007 | Ko et al. | |

FOREIGN PATENT DOCUMENTS

| | | |
|---|---|---|
| JP | 2004-47988 | 2/2004 |
| JP | 2004-221529 | 8/2004 |

(Continued)

*Primary Examiner* — Michael Shingleton
(74) *Attorney, Agent, or Firm* — McDermott Will & Emery LLP

(57) ABSTRACT

In a semiconductor light emitting device, in which a light emitting layer is formed on one surface of a conductive substrate, and an n-type electrode and a p-type electrode are formed on the same side as the light emitting layer, there has been the problem that, if larger electric power is applied, heat is generated near the n-side electrode to reduce luminous efficiency. The n-side electrode has a predetermined length at a corner portion or along an edge of the substrate to disperse a current flowing from the n-side electrode into the substrate, thereby avoiding heat generation near the n-side electrode. In this type of semiconductor light emitting element, the existence of the n-side electrode reduces a light emitting area. Therefore, the length of the n-side electrode preferably ranges from 20% to 50% of the entire peripheral length of the substrate.

7 Claims, 12 Drawing Sheets

FOREIGN PATENT DOCUMENTS

| | | |
|---|---|---|
| JP | 2006-73618 | 3/2006 |
| JP | 2006-156590 | 6/2006 |
| JP | 2006-287193 | 10/2006 |
| JP | 2007-116153 | 5/2007 |
| JP | 2007-134443 | 5/2007 |
| JP | 2007-266427 | 10/2007 |
| JP | 2007-281426 | 10/2007 |
| KR | 10-0506743 | 8/2005 |
| KR | 10-0647018 | 11/2006 |
| WO | WO 2007/055262 A1 | 5/2007 |

* cited by examiner

SEMICONDUCTOR LIGHT EMITTING ELEMENT AND SEMICONDUCTOR LIGHT EMITTING DEVICE USING THE SAME

RELATED APPLICATIONS

This application is the U.S. National Phase under 35 U.S.C. §371 of International Application No. PCT/JP2008/003118, filed on Oct. 30, 2008, which in turn claims the benefit of Japanese Application No. 2007-285000, filed on Nov. 1, 2007, the disclosures of which Applications are incorporated by reference herein.

TECHNICAL FIELD

The present invention relates to semiconductor light emitting elements, in which n-side electrodes and p-side electrodes are arranged on one sides of conductive substrates, and semiconductor light emitting devices including the elements on submounts.

BACKGROUND ART

A semiconductor light emitting element used for a light emitting diode, a laser diode, or the like can be obtained by forming a light emitting layer, which emits light, on a sapphire or GaN substrate. In the light emitting layer, an active layer for emitting light is interposed between a p-type semiconductor and an n-type semiconductor.

The active layer emits light using a forward current at a pn junction. Therefore, when the active layer is formed flat, a current needs to be uniformly supplied to the flat active layer to improve luminous efficiency.

In order to uniformly supply a current to the flat active layer, a p-side electrode and an n-side electrode may be respectively attached to the p-type and n-type semiconductors, between which the active layer is interposed. However, when electrodes are arranged, which completely cover the semiconductors on and under the active layer, light cannot be obtained from the active layer.

Therefore, when two electrodes of p-side and n-side are provided on one surface of a substrate, special care needs to be taken to determine shapes of the electrodes, or a transparent electrode made of, e.g., ITO is used for one of the electrodes.

As an example, Patent Document 1 shows a semiconductor light emitting element, in which an active layer having a relatively large area is formed on a substrate made of a material such as sapphire, which has a low electrical conductivity. Electrodes are arranged in a comb-like shape to uniformly supply a current to the active layer, and a p-side electrode in any position is spaced apart from an n-side electrode by a predetermined distance or less.

On the other hand, when a conductive substrate is used as the substrate, on which a light emitting layer is formed, since a current passes through the substrate, the current can be relatively uniformly supplied from a p-side to an n-side, even if two electrodes of p-side and n-side are provided on one surface of the substrate. However, in this case, since the n-type semiconductor layer, the active layer, and the p-type semiconductor layer are stacked sequentially, an electrode supplying a current to one of the semiconductor layers needs to be formed after removing the active layer. This reduces the area of emitting light. Thus, an electrode for one of the semiconductor layers is formed with a large area, and an electrode for the other semiconductor layer is formed with a small area. Typically, a p-side electrode is formed with a large area, and an n-side electrode is formed with a small area.

As an example of this semiconductor light emitting element, Patent Document 2 shows a semiconductor light emitting element, in which a p-side electrode and an n-side electrode are formed on one surface of a conductive GaN substrate. In this semiconductor light emitting element, an n-type semiconductor layer, an active layer, and a p-type semiconductor layer are sequentially formed on a substrate. The p-side electrode is formed on the p-type semiconductor layer. The n-side electrode is formed on the n-type semiconductor layer after removing the p-type semiconductor layer and the active layer. The n-side electrode is formed at only one corner of the substrate.

PATENT DOCUMENT 1: Japanese Patent Publication No. 2004-47988

PATENT DOCUMENT 2: Japanese Patent Publication No. 2007-266427

SUMMARY OF THE INVENTION

Technical Problem

As described above, an n-side electrode can be formed small when using a conductive substrate, even if a p-side electrode and the n-side electrode are formed on one surface of the substrate. However, when higher currents are injected to increase the amount of emitting light, the currents injected from the n-side electrode to a semiconductor are concentrated to flow through a narrow region in the semiconductor near the n-side electrode, since the n-side electrode is small. This causes the problem that Joule heat caused by bulk resistivity of the semiconductor generates heat near the n-side electrode, thereby reducing luminous efficiency of the active layer.

Solution to the Problem

The present invention seeks to solve the above-described problem. Specifically, the present invention provides a semiconductor light emitting element including a conductive substrate; a light emitting layer including an n-type semiconductor layer, an active layer, and a p-type semiconductor layer, which are sequentially stacked on the conductive substrate; a p-side electrode formed on the p-type semiconductor layer; and an n-side electrode formed on the n-type semiconductor layer, which is exposed by removing a part of the light emitting layer, or on the conductive substrate. The n-side electrode is formed on a part of the conductive substrate including a corner portion or an edge of the conductive substrate, and has a predetermined length with respect to an entire peripheral length of the conductive substrate. The present invention further provides a semiconductor light emitting device mounting the semiconductor light emitting element on a submount.

Advantages of the Invention

In the semiconductor light emitting element according to the present invention, an n-side electrode is formed on a part of a conductive substrate including a corner portion or an edge of the conductive substrate, and the n-side electrode has a uniform length with respect to the entire peripheral length of the conductive substrate. This reduces heat generation, and thus, luminous efficiency does not decrease even if a large current flows.

DESCRIPTION OF REFERENCE CHARACTERS

Figure 1:
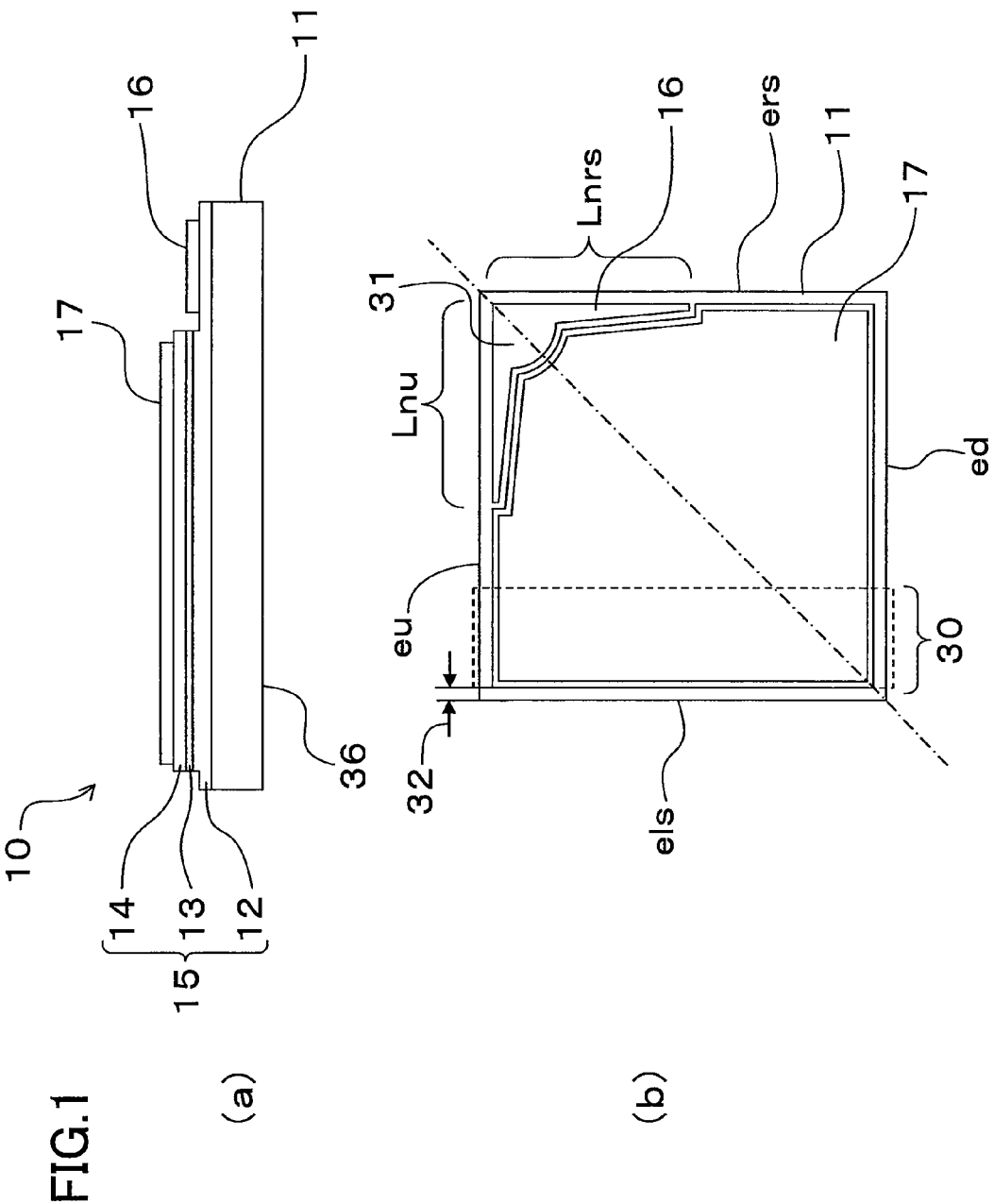
FIG. 1 illustrates an example structure of a semiconductor light emitting element according to the present invention.

1 Semiconductor Light Emitting Device
10 Semiconductor Light Emitting Element
11 Substrate
12 N-Type Layer
13 Active Layer
14 P-Type Layer
16 N-Side Electrode
17 P-Side Electrode
21 Submount
22 N-Side Extraction Electrode
23 P-Side Extraction Electrode
24 N-Side Bump
25 P-Side Bump

DESCRIPTION OF EMBODIMENTS

FIG. 1(a) is a cross-sectional view of a semiconductor light emitting element 10, and FIG. 1(b) is a plan view seen from a surface provided with electrodes. FIG. 1(a) illustrates the cross-section taken along the dot-dash line in FIG. 1(b). Referring to FIG. 1(a), the semiconductor light emitting element 10 includes a substrate 11, an n-type semiconductor layer 12, an active layer 13, a p-type semiconductor layer 14, an n-side electrode 16, and a p-side electrode 17. The n-type semiconductor layer 12 and the p-type semiconductor layer 14 are also referred to as an "n-type layer" and a "p-type layer," respectively. Furthermore, the n-type layer 12, the active layer 13, and the p-type layer 14 form a light emitting layer 15. The surface of the substrate 11, which does not include the light emitting layer, is a light emitting plane 36.

FIG. 1(b) is the plan view of the semiconductor light emitting element 10 seen from the side provided with the n-side electrode and the p-side electrode. The sides of the substrate are referred to as "eu," "ers," "els," and "ed," and the respective lengths are referred to as "Leu," "Lers," "Lels," and "Led." In the specification, the length of each side does not include a part 32 extending from an end of the substrate to the light emitting layer 15.

In the semiconductor light emitting element of the present invention, the n-side electrode is formed with a uniform length along an edge 30 of the substrate. The "edge" denotes a region on a surface of the substrate, which extends 100 μm from each side. In FIG. 1(b), the region 30 along the edge of els is indicated by a dashed line. A "corner portion" denotes a region ranging from about 30 to about 200 μm, when the substrate is a polygon.

By forming the n-side electrode along the edge of the substrate, a large active layer can be obtained in the substrate to improve a light emitting output.

In the drawing, the n-side electrode is formed along two sides from a top right corner (or corner portion), specifically in the part Lnu formed along the top side eu, and the part Lnrs formed along the right side ers. The n-side electrode may have a width of about 20 μm. If the width is too small, the electrode is difficult to form. If the width is too large, the area for the light emitting layer is reduced.

Figure 2:
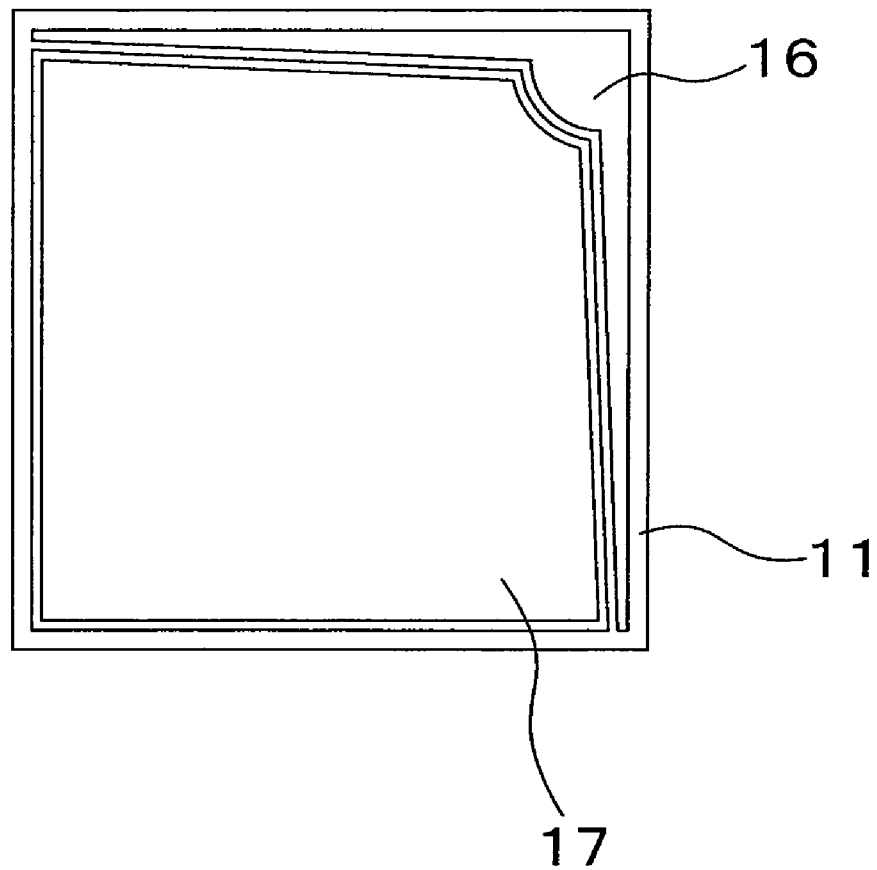
FIG. 2 illustrates the case where a length of an n-side electrode accounts for about 50%.

The length of the n-side electrode represents the total length of the parts of the n-side electrode along two sides of the substrate 11. In the figure, the total length of Lnu and Lnrs is referred to as a length "Ln" of the n-side electrode. Also, as will be described with reference to FIG. 3 and the subsequent figures, the length Ln of the n-side electrode preferably ranges from 20% to 50% of the entire peripheral length of the substrate. The entire peripheral length Lsub of the substrate is the total length of Leu, Lers, Lels, and Led. Furthermore, the n-side electrode may include a pad region 31 for forming a pad. The pad region 31 is the place for forming a stud bump, and the area for the region may have a diameter ranging from about 30 to about 200 μm. Note that the length of the n-side electrode includes the length of the pad region. FIG. 2 illustrates the case where the n-side electrode has a length of about 50% of the entire peripheral length Lsub of the substrate.

Referring to FIG. 1 again, a more detailed description will be provided. The substrate 11 has the function of holding the light emitting layer. In the semiconductor light emitting element according to the present invention, a conductive transparent substrate is used as a material. For example, gallium nitride (GaN) compound semiconductor, silicon carbide (SiC) semiconductor, or aluminum nitride (AlN) compound semiconductor can be preferably used.

Furthermore, these materials are preferably used when the light emitting layer is made of gallium nitride compound semiconductor, since they have refractive indexes close to that of the gallium nitride compound semiconductor to reduce light refraction at the interface between the substrate and the light emitting layer. When the light emitting layer contains zinc oxide (ZnO) as a base material, the substrate is preferably made of zinc oxide compound semiconductor.

The present invention is advantageous in reducing heat generation near the n-side electrode, particularly when a large current is applied, and thus, is preferably used as a semiconductor light emitting element, in which a large current flows. Therefore, the substrate 11 preferably has a large area. Specifically, a substrate having a side of 400 μm or more is preferable.

The n-type layer 12, the active layer 13, and the p-type layer 14, which form the light emitting layer, are sequentially stacked on the substrate 11. The material is not limited thereto, but is preferably a gallium nitride compound. Specifically, the n-type layer 12 of GaN, the active layer 13 of InGaN, and the p-type layer 14 of GaN are preferably used. Note that AlGaN, InGaN, or a multilayer of these materials may be used for the n-type layer 12 and the p-type layer 14. Also, a buffer layer made of GaN, InGaN, or AlInGaN can be used between the n-type layer 12 and the substrate 11. Moreover, for example, the active layer 13 may have a multilayer structure (a quantum well structure) including well layers of InGaN or AlInGaN and barrier layers of GaN or AlGaN, which are alternately stacked.

In a part of the n-type layer 12, the active layer 13, and the p-type layer 14, which are stacked in this manner, the active layer 13 and the p-type layer 14 are removed to expose the n-type layer 12. The n-side electrode 16 is formed on the exposed n-type layer 12. Also, the p-side electrode 17 is formed on the p-type layer 14. That is, the active layer 13 and the p-type layer 14 are removed to expose the n-type layer 12 so that the light emitting layer and the p-side and n-side electrodes are formed on the same surface of the substrate. Note that the n-side electrode may be formed on the conductive substrate 11, which is exposed by removing the n-type layer 12.

A reflective electrode made of, e.g., Ag, Al, and Rh with high reflectivity is preferably used as the p-side electrode 17 so that the light emitting plane 36 reflects light emitted from the light emitting layer 15. In this case, a contact layer formed of a thin metal film of, e.g., Pt, Pd, Ni, and Co, or a conductive oxide film of, e.g., ITO, and ZnO is preferably formed between the reflective electrode and the p-type layer 14 to reduce ohmic contact resistance between the reflective electrode and the p-type layer 14. Also, an electrode for bonding, which is made of Au, is preferably formed on the reflective electrode with a barrier metal of, e.g., Ti, W, Ni, and Pt interposed therebetween.

The n-side electrode 16 is preferably formed on and in contact with the n-type semiconductor (layer) 12 or a conductive substrate, and is preferably made of Al with high reflectivity so that the light emitting plane reflects light. On the other hand, the surface of the n-side electrode 16 is preferably made of Au to function as an electrode for bonding. Au such, an Al layer is formed, on which a barrier metal layer made of an element of Ti, Pt, Ni, or W is formed, and then an Au layer is preferably formed on the barrier metal layer. These electrodes can be formed by, e.g., vacuum deposition and sputtering.

Figure 3:
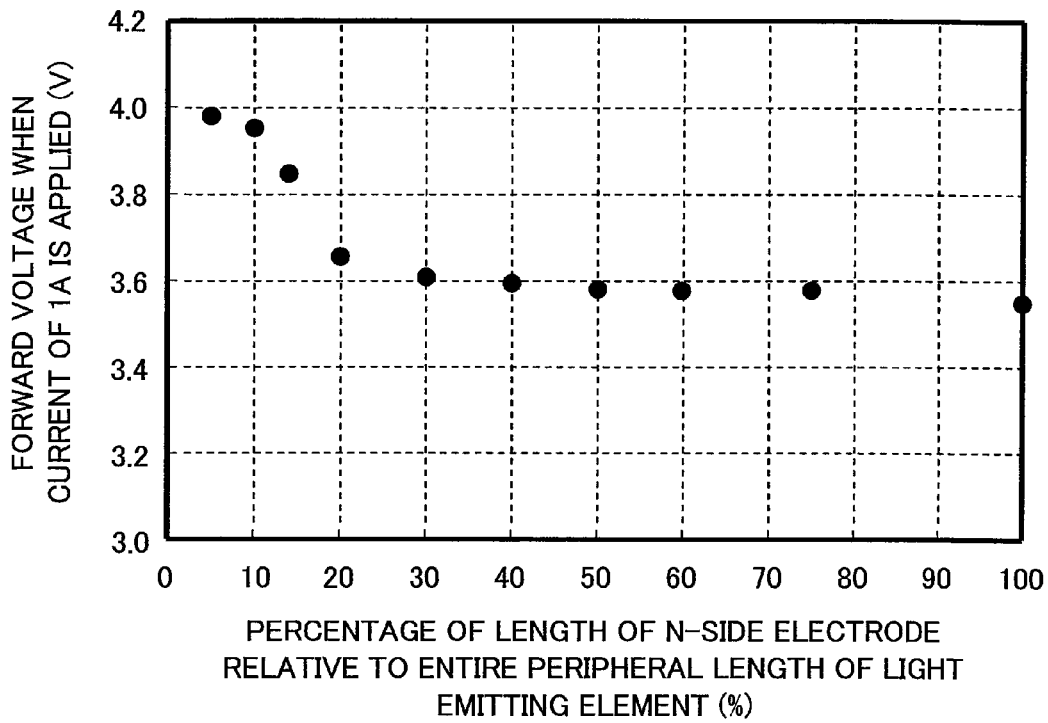
FIG. 3 illustrates the relationship between a percentage of the length of the n-side electrode and a forward voltage when a current of 1 A is applied.

Next, the length Ln of the n-side electrode will be described. FIG. 3 illustrates the relationship between the percentage of the length Ln of the n-side electrode relative to the entire peripheral length Lsub of the substrate, and a forward voltage when a current of 1 A is applied to the semiconductor light emitting element. The percentage of the length Ln of the n-side electrode relative to the entire peripheral length Lsub of the substrate is referred to as a "percentage of the length of the n-side electrode."

Note that the values shown in FIG. 3 are obtained from the following semiconductor light emitting element. A conductive substrate of GaN, which has a square shape of 1000 μm per side is used as the substrate, and a light emitting layer of GaN is formed with a total thickness of 3 μm. The light emitting element has a total thickness of 100 μm. With respect to electrodes, an n-side electrode is made of Al/Ti/W/Au, and a p-side electrode is made of Pt/Ag/Ti/W/Au, in the order from the side being in contact with a semiconductor layer.

The n-side electrode has a larger length Ln in FIG. 2 than in FIG. 1. The state where the percentage of the length of the n-side electrode relative to the peripheral length of the substrate is 100% means that the n-side electrode is formed around the entire periphery of the substrate.

Referring to FIG. 3, the forward voltage is high where the percentage of the length of the n-side electrode is 20% or less. Where the percentage is more than 20%, the voltage is at a constant value.

The reason for this is considered as follows. With an increase in the length Ln of the n-side electrode, the cross-sectional area is increased, through which a current from the n-side electrode into the directly underlying n-type layer and the substrate flows, when the current is laterally diffused through the substrate. This reduces electrical resistance when the current passes through the region, thereby preventing a rise in the forward voltage.

Figure 4:
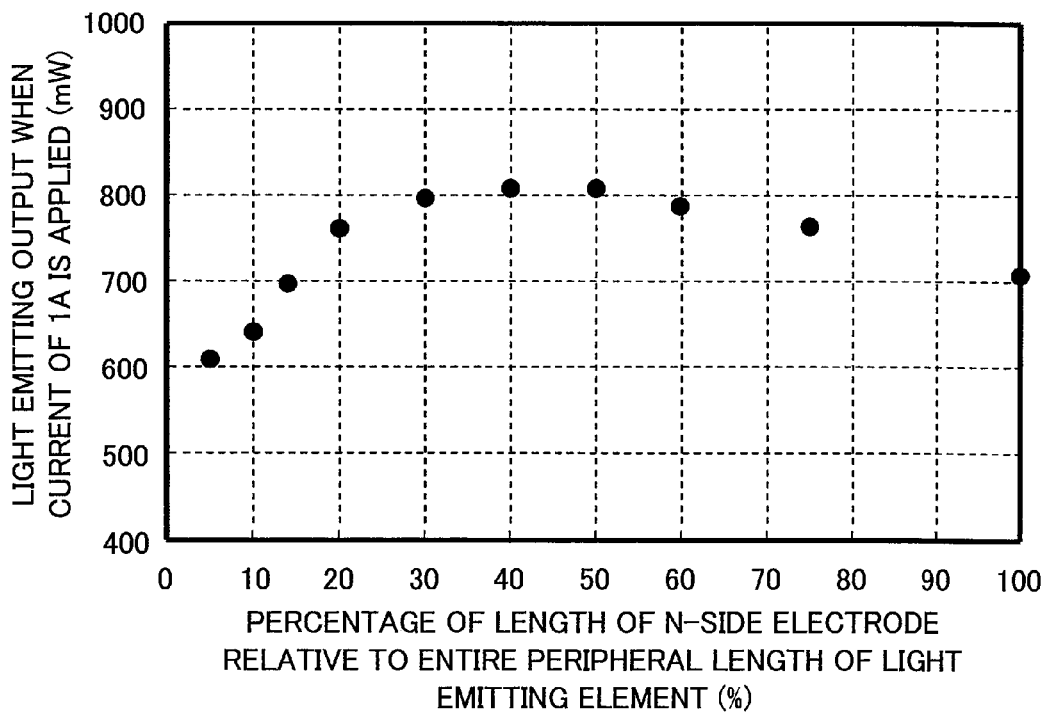
FIG. 4 illustrates the relationship between the percentage of the length of the n-side electrode and a light emitting output when the current of 1 A is applied.

FIG. 4 illustrates the relationship between the percentage of the length of the n-side electrode and a light emitting output when a current of 1 A is applied. The light emitting output increases until the percentage of the length of the n-side electrode reaches about 20%, and thereafter, the light emitting output is at a constant value. When the percentage is greater than 50%, the light emitting output decreases. The result can be explained as below.

In a region, in which the percentage of the length of the n-side electrode is less than 20%, the current flowing from the n-side electrode into the substrate passes through a small cross-sectional area. This increases the electrical resistance to generate heat near the n-side electrode, and the active layer is heated by the heat to reduce the luminous efficiency. In addition, this causes crowding of currents flowing into the active layer near the n-side electrode to increase current density in the region. This also reduces the luminous efficiency.

In a region, in which the percentage of the length of the n-side electrode is greater than about 50%, an increase in the length of the n-side electrode increases the total area for the n-side electrode, and accordingly reduces the area of the p-side electrode (i.e., the area of the active layer). This increases the current density in the active layer, thereby gradually reducing the luminous efficiency.

From the foregoing, with an increase in the percentage of the length of the n-side electrode, heat generation near the n-side electrode and current crowding in the active layer can be reduced to effectively improve the luminous efficiency. However, if the semiconductor light emitting element has electrodes of both sides of n side and p side on one surface of the substrate, and if the percentage of the length of the n-side electrode is greater than 50%, the light emitting area itself decreases to reduce the luminous efficiency in accordance with an increase in the current density. This reduces the amount of the emitting light.

While the element of 1000 μm is described above in detail, the size of the element is not limited thereto. With a change in the size of the element, the value of the applied current changes. The forward voltage and the light emitting output respectively have similar dependency on the percentage of the length of the n-side electrode to that shown in FIGS. 3 and 4. Similar dependency on the percentage of the length of the n-side electrode is obtained with a current smaller than 1 A if the element is smaller than 1000 μm, and with a current larger than 1 A if the element is larger than 1000 μm. In other words, the preferable range of the percentage of the length of the n-side electrode illustrated in FIGS. 3 and 4 does not depend on the size of the element.

The following are example variations of the shape of the n-side electrode in the semiconductor light emitting element according to the present invention. However, the semiconductor light emitting element of the present invention is not limited thereto.

Figure 5:
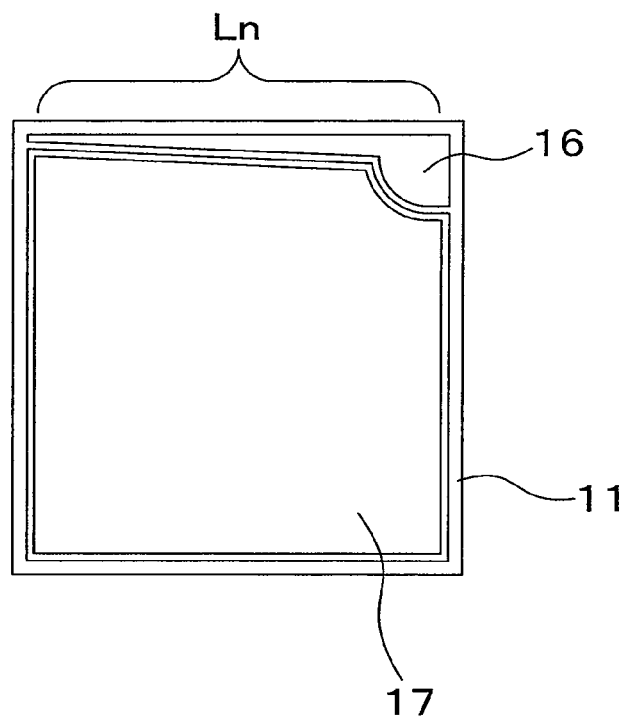
FIG. 5 illustrates an example configuration of an n-side electrode.

FIG. 5 illustrates the case where a pad region is formed at a top right corner, and an n-side electrode is formed along the entire top side. In this case, the percentage of the length of the n-side electrode is about 25%, since the length Ln of the n-side electrode is entirely formed along one side of the substrate.

Figure 6:
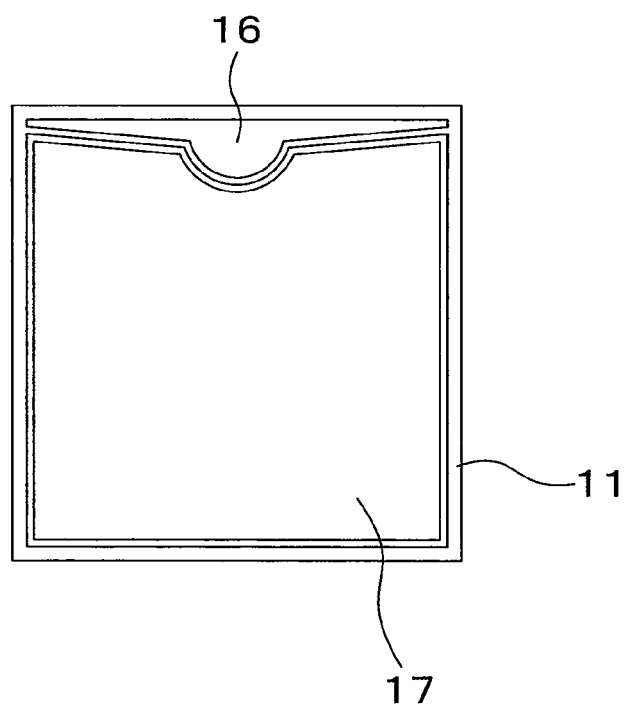
FIG. 6 illustrates an example configuration of an n-side electrode.

FIG. 6 illustrates the case where the pad region is formed in a central portion of a top side. As such, the pad region is not necessarily formed at a corner. The pad region is also preferably formed at a center of the n-side electrode, since a current is effectively diffused in two directions. Note that, if a pad region is at a corner of a substrate as shown in FIG. 1 and the lengths of two sides of an n-side electrode are the same, the pad region is considered as being located at the center of the n-side electrode.

Figure 7:
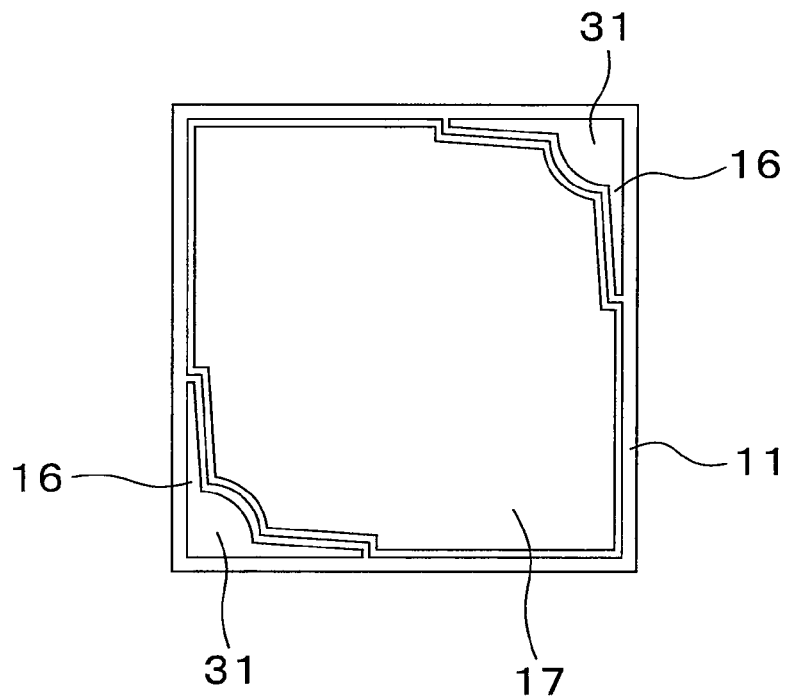
FIG. 7 illustrates example configurations of n-side electrodes.

FIG. 7 illustrates the case where pad regions 31 are formed in two parts having diagonal relationship, i.e., at a top right corner and a bottom left corner. N-side electrodes are formed in two parts, from a top side to a right side, and from a left side to a bottom side. In this case, the length of the n-side electrodes denotes the total length of the electrodes in the two parts. Therefore, in FIG. 7, when calculated in a percentage, the length of the n-side electrodes accounts for about 40%.

Figure 8:
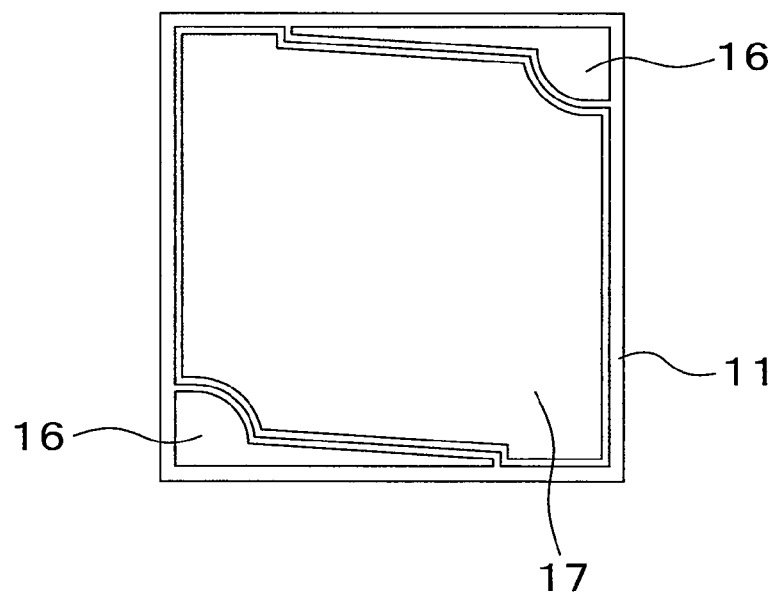
FIG. 8 illustrates example configurations of n-side electrodes.

FIG. 8 illustrates the case where pad regions are provided in two portions, which have also a diagonal relationship, and n-side electrodes are formed only along a top side and a bottom side. In this case, the percentage of the length of the n-side electrodes is about 35%.

Figure 9:
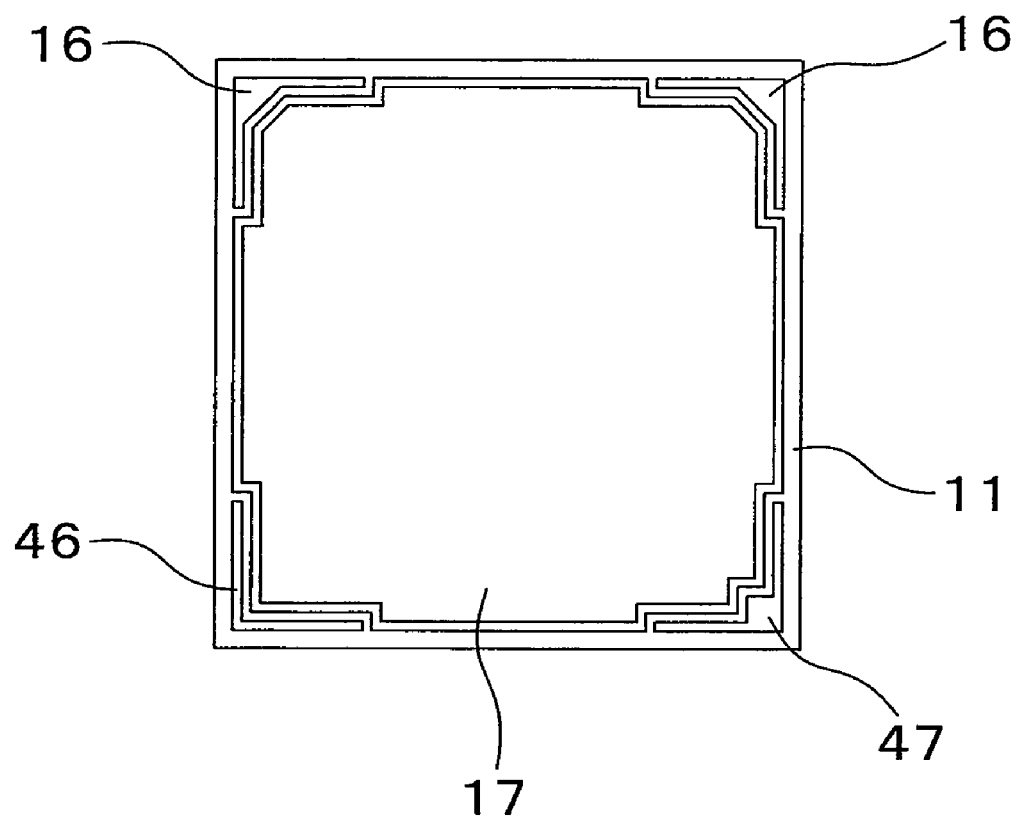
FIG. 9 illustrates example configurations of n-side electrodes.

FIG. 9 illustrates an example where n-side electrodes are formed at four corners. In this example, the n-side electrodes are not provided with pad regions for forming stud bumps. In a type of device including a light emitting layer, a p-side electrode, and an n-side electrode formed on one surface of a conductive substrate as described in the present invention, formation of the n-side electrode reduces the area of the light emitting layer. In particular, since a pad region occupies a relatively large area, the area of the light emitting layer is significantly reduced, if n-side electrodes are formed in four parts as shown in FIG. 9, and each of the electrodes is provided with a pad region for forming a stud bump. Therefore, the pad regions are not necessarily formed in all of the n-side electrodes.

If an n-side electrode does not include a pad region, a plated bump is preferably formed on the n-side electrode. Since a plated bump can be formed in an area smaller than that for a stud bump, a larger area can be obtained for the light emitting layer to effectively improve the luminous efficiency. Also, the cross-sectional shape can be designed as desired. While in FIG. 9, triangle regions are formed in the n-side electrodes in two upper corner portions of the drawing to obtain large cross-sectional areas for plated bumps, each n-side electrode may simply have a linear shape like a bottom left corner portion 46, or may have a square region like a bottom right corner portion 47. The shapes of the n-side electrodes are merely examples, and are not limited thereto. These shape variations may be used in combination, or any one of the variations may be used to form all of the four corners.

Figure 10:
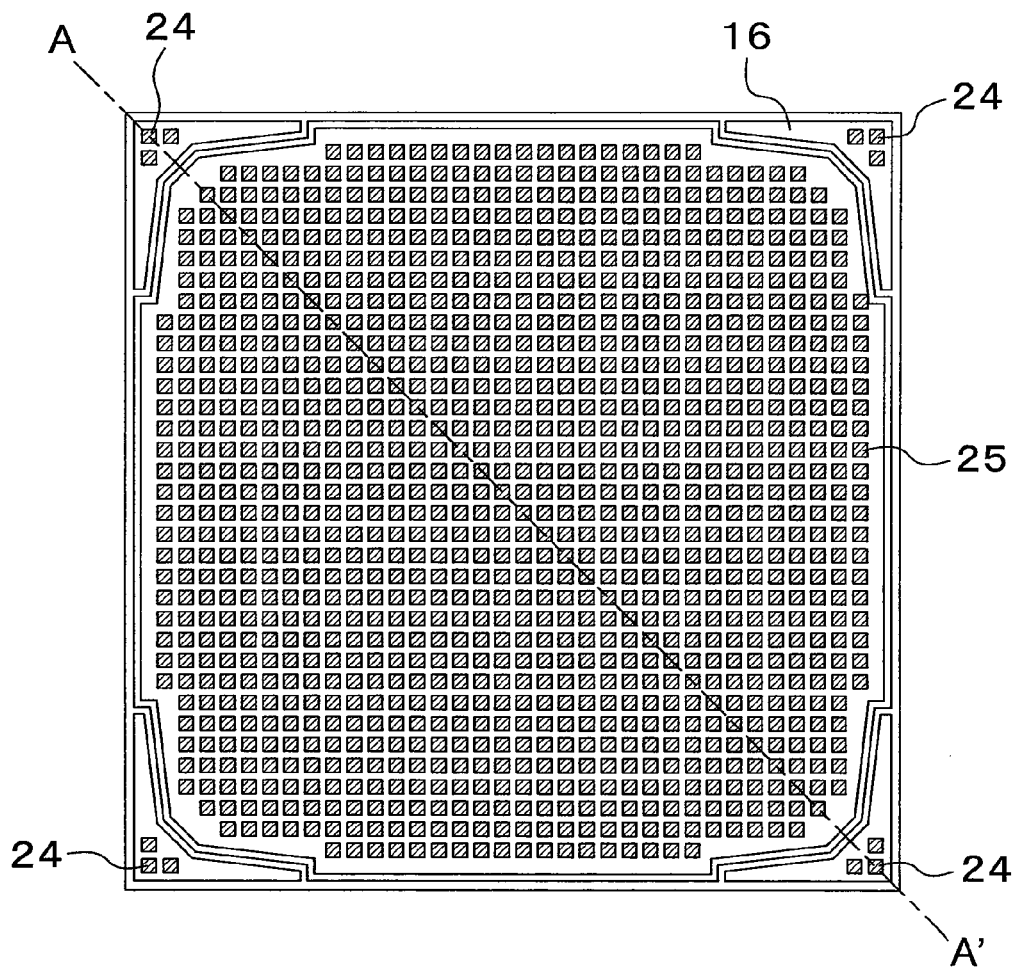
FIG. 10 illustrates example configurations of n-side electrodes using plated bumps.

FIG. 10 illustrates an example where n-side electrodes 16 are provided in four corner portions, and n-side plated bumps 24 are formed on upper surfaces of the n-side electrodes. The n-side electrodes are formed to extend along edges of the substrate with predetermined lengths. As already described, this configuration reduces resistance between the n-side electrodes and the p-side electrode. Furthermore, excellent adhesiveness and heat dissipation properties can be obtained by providing p-side plated bumps 25 on a p-side electrode.

Figure 11:
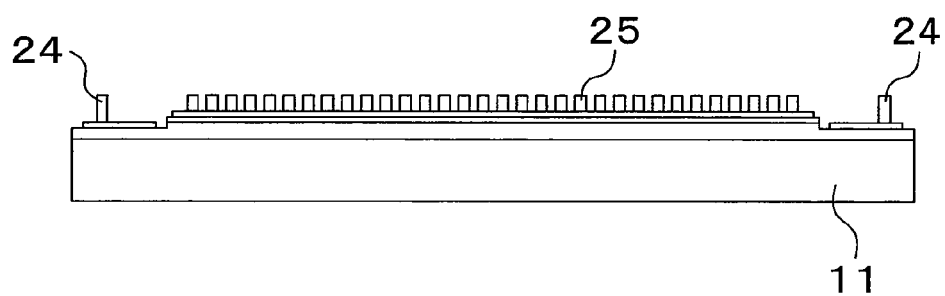
FIG. 11 is a cross-sectional view of FIG. 10.

FIG. 11 illustrates a cross-section of the semiconductor light emitting element taken along the line A-A' in FIG. 10. By densely forming as many as possible of plated bumps 25 on the p-side electrode, the adhesiveness and the heat dissipation properties of the light emitting element are improved. In this respect, a metal film formed by plating is suitable for high volume manufacturing of relatively thick films at moderate costs. That is, dense plated bumps are easily formed and are effective means for improving adhesiveness and heat dissipation properties of a light emitting element.

Figure 12:
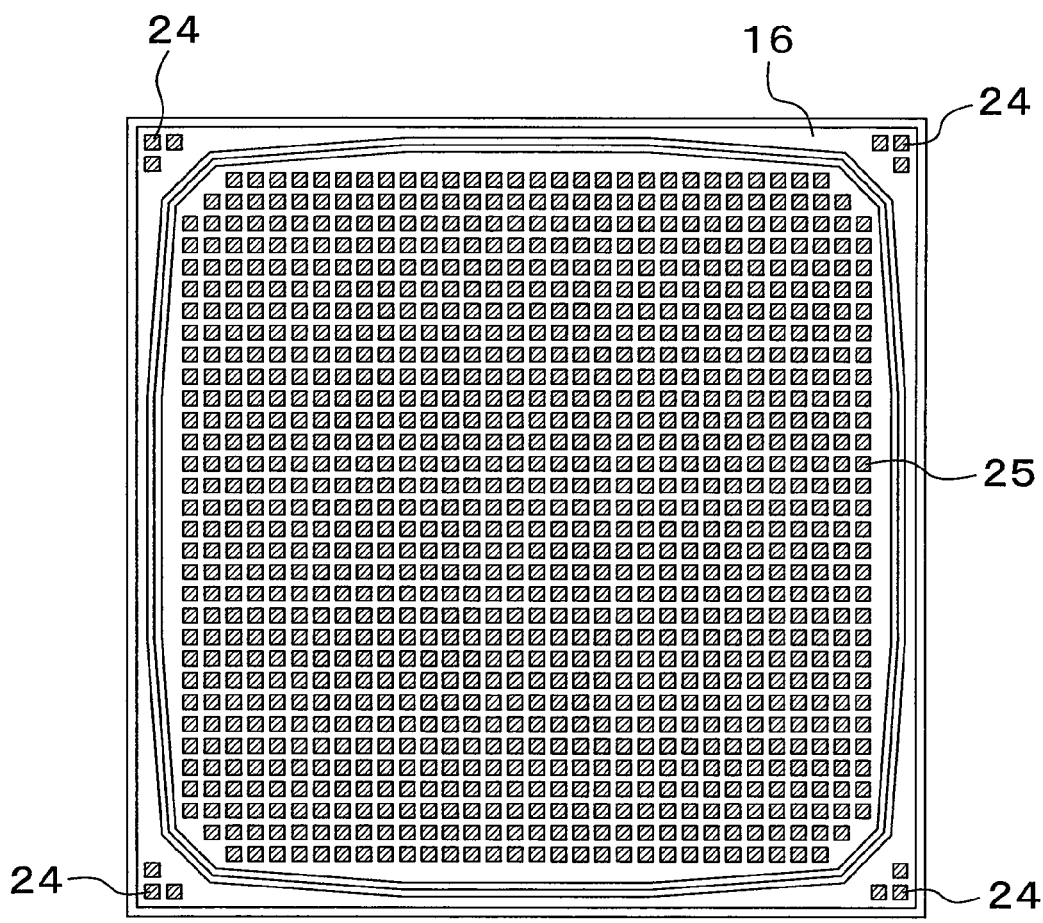
FIG. 12 illustrates example configurations of n-side electrodes and a p-side electrode using plated bumps.

FIG. 12 illustrates another variation. In the figure, an n-side electrode 16 covers the entire edge of a substrate. Plated bumps are formed at four corners of the substrate. Plated bumps 25 on a p-side electrode are densely formed.

Figure 13:
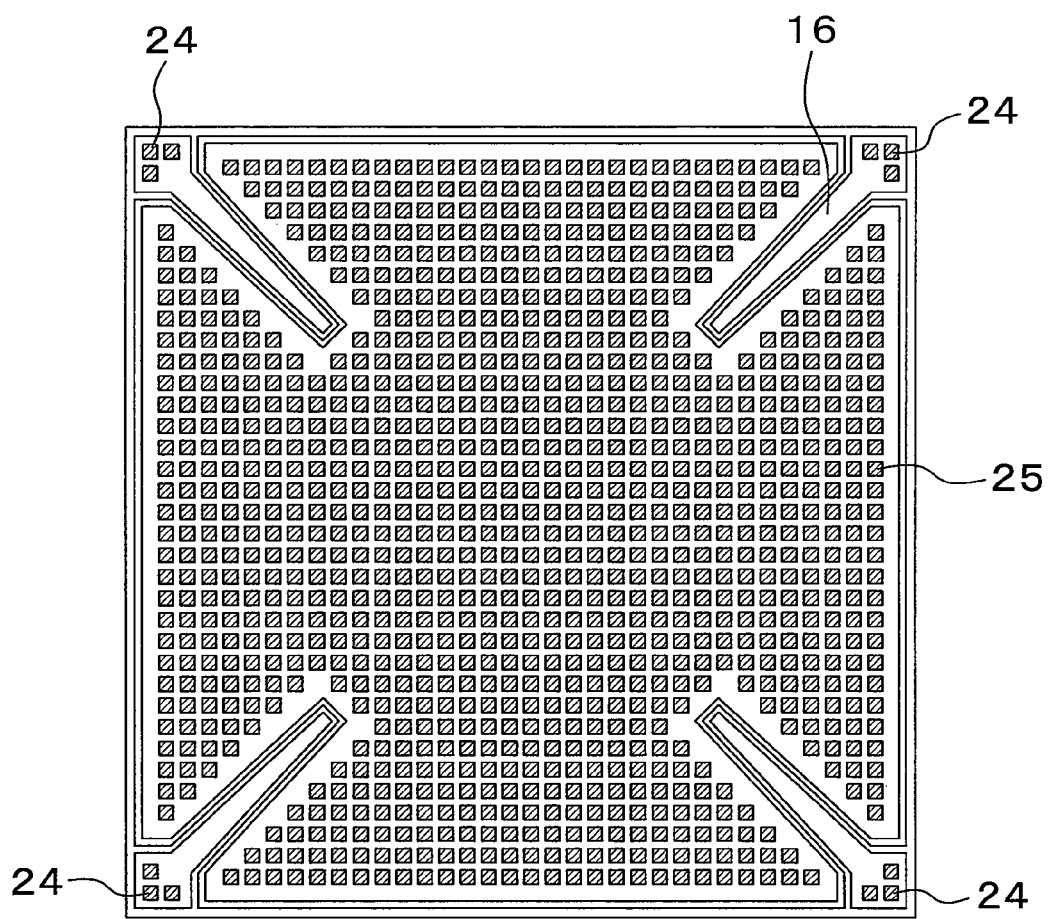
FIG. 13 illustrates example configurations of n-side electrodes and a p-side electrode using plated bumps.

FIG. 13 illustrates another variation. In the figure, n-side electrodes extend not along edges of a substrate but to the center. This configuration reduces moving distances of electrons, and thus, resistance between the p-side electrode and the n-side electrodes as a whole.

Figure 14:
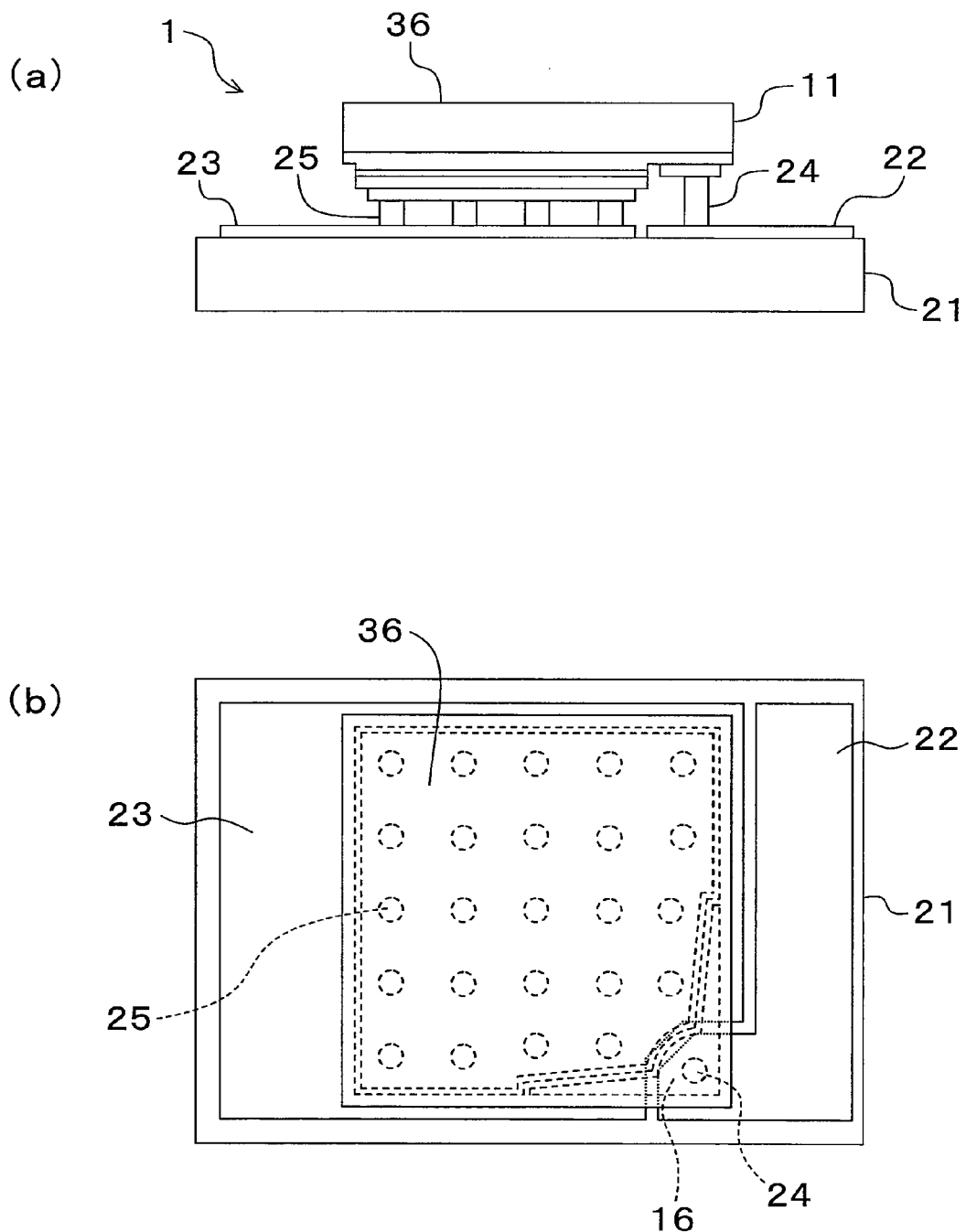
FIG. 14 illustrates an example structure of a semiconductor light emitting device according to the present invention.

FIG. 14 illustrates an example semiconductor light emitting device 1 using the semiconductor light emitting element 10 of the present invention. In the semiconductor light emitting device 1, the semiconductor light emitting element 10 is mounted on a submount. FIG. 14(a) is a cross-sectional view, and (b) is a plan view seen from a light emitting plane 36.

Extraction electrodes are formed on a submount 21. The extraction electrodes are electrodes for applying currents to the semiconductor light emitting element 10. There are an n-side extraction electrode 22 coupled to the semiconductor light emitting element at the side of an n-type layer, and a p-side extraction electrode 23 coupled to the element at the side of a p-type layer.

Bumps are formed on the extraction electrodes. Similar to the extraction electrodes, there are an n-side bump 24 coupled to the n-type layer, and a p-side bump 25 coupled to the p-type layer. FIG. 14 shows a plurality of p-side bumps, which are collectively denoted by reference numeral 25.

The extraction electrodes and electrodes of the semiconductor light emitting element are electrically coupled together by the bumps. That is, the bumps are the coupling means. While in this figure, the bumps are formed on the extraction electrodes, they may be formed in advance in the semiconductor light emitting element, as the plated bumps illustrated in FIGS. 10-13 are.

Figure 15:
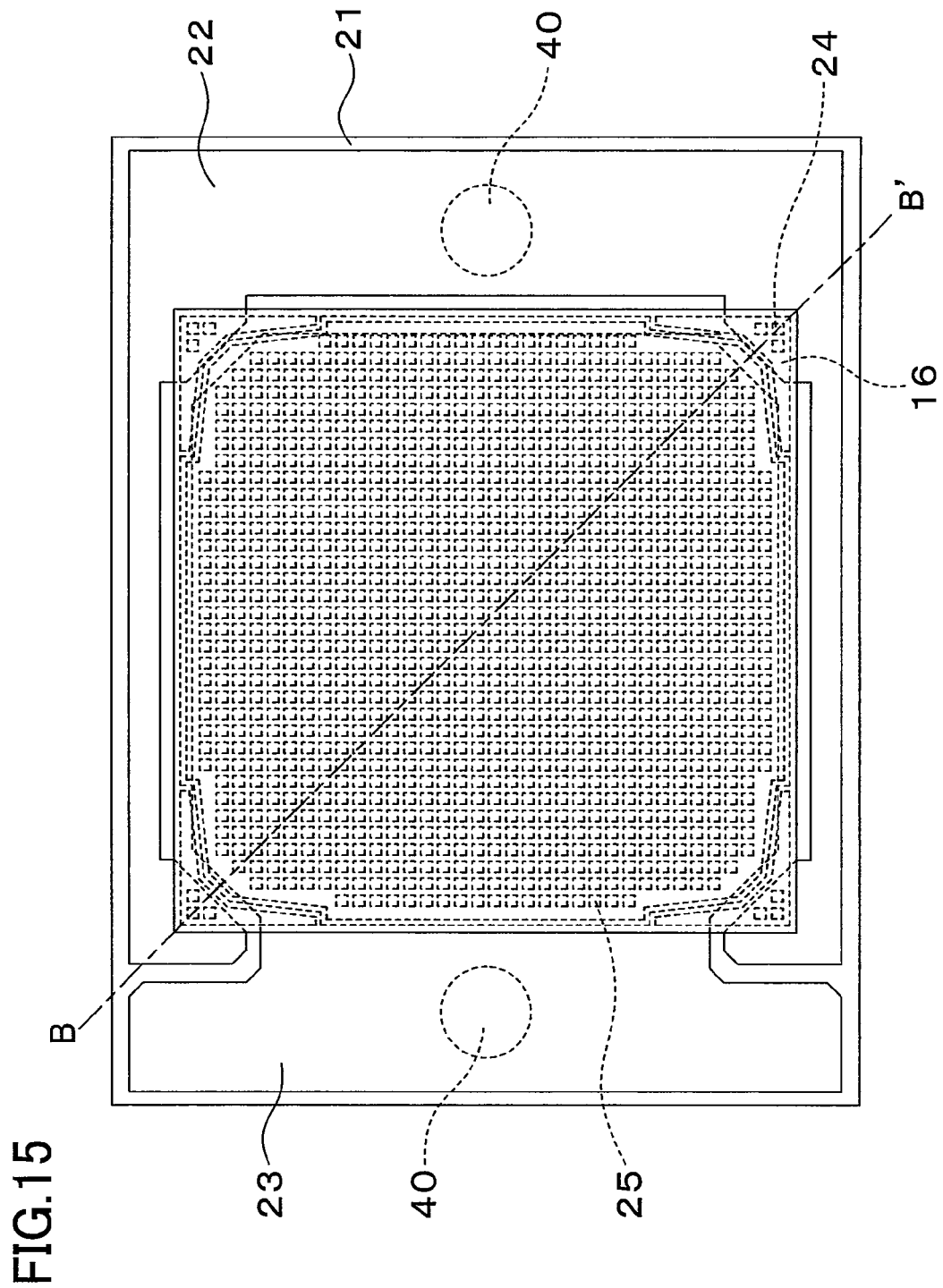
FIG. 15 illustrates an example structure of a semiconductor light emitting device according to the present invention.
Figure 16:
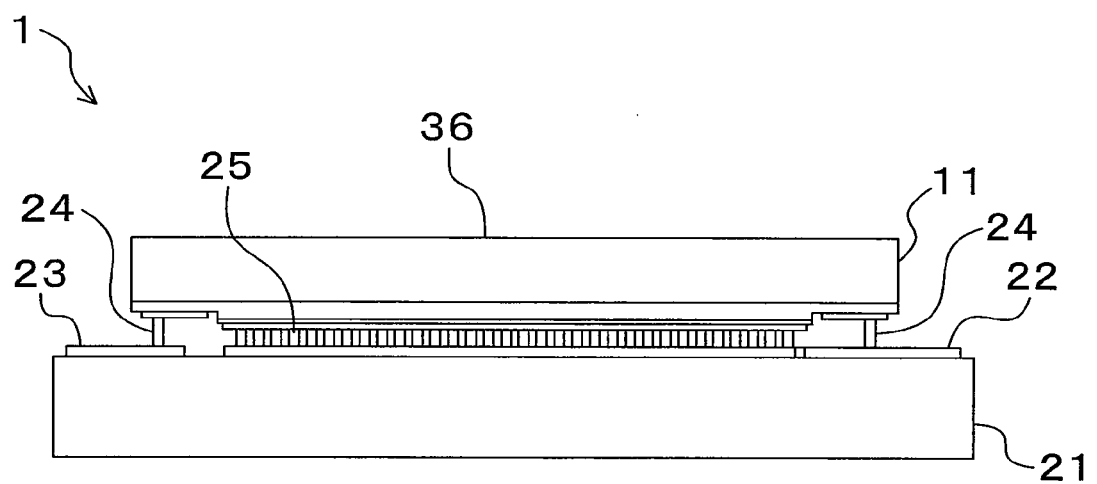
FIG. 16 illustrates an example structure of a semiconductor light emitting device according to the present invention.

FIGS. 15 and 16 are respectively, a plan view of a semiconductor light emitting element using plated bumps, and a cross-sectional view taken along the line B-B' in FIG. 15. The same reference characters are used for the same parts as in FIG. 14. Reference numeral 40 denotes through-holes formed in a submount. The inside of the through-holes are filled with a metal or the like so that the through-holes obtain conductivity from the back side of the submount. As such, through-holes may be formed in the submount.

Note that silicon zener diode, silicon diode, silicon, aluminum nitride, alumina, other ceramics, or the like can be used for the submount 21.

The bumps can be made of, e.g., gold, gold-tin, solder, an indium alloy, and conductive polymer. In particular, gold or a material containing gold as a main component is preferable. The bumps can be formed, e.g., by plating, vacuum deposition, screen-printing, spraying, and wire bumping using these materials.

For example, the semiconductor light emitting element in a wafer state, which is not yet separated into individual pieces, is covered with a photo resist by photolithography except for formation regions of plated bumps; and then the plated bumps are formed on electrodes of the semiconductor element by electrolytic plating. Furthermore, a gold wire is formed by wire bumping, and the end of the wire is boded to extraction electrodes on a submount using a bonder. Then, the wire is cut off to form a gold bump. Furthermore, spraying can be used, in which liquid containing fine nanoparticles made of a high conductive material such as gold dispersed in a volatile solvent is sprayed by a method similar to ink jet printing, and the solvent is volatilized to form a bump as an aggregation of the nanoparticles on the submount.

In the semiconductor light emitting device shown in FIG. 14, the n-side electrode 16 of the semiconductor light emitting element is formed along the edge of the substrate 11 with a predetermined length. A current from the n-side bump 24 is also supplied to the conductive substrate from a part along the edge. Thus, the phenomenon can be avoided, in which the current density increases near the n-side electrode to generate heat and reduce the luminous efficiency. This configuration is advantageous particularly in a type of semiconductor light emitting device, which allows a large current of 500 mA or more to flow.

Note that throughout the specification, Al represents aluminum, N represents nitrogen, O represents oxygen, Ag represents silver, Rh represents rhodium, Pt represents platinum, Pd represents palladium, Ni represents nickel, Co represents cobalt, Ti represents titanium, W represents tungsten, Au represents gold, Ga represents gallium, In represents indium, and Zn represents zinc.

INDUSTRIAL APPLICABILITY

The present invention can be utilized for a semiconductor light emitting element, in which an n-side electrode and a p-type electrode are provided on one surface of a substrate, and the opposite surface of the substrate is a light emitting plane, as well as a semiconductor light emitting device using the same.

The invention claimed is:

1. A semiconductor light emitting element comprising:
a conductive substrate;
a light emitting layer including an n-type semiconductor layer, an active layer, and a p-type semiconductor layer, which are sequentially stacked on the conductive substrate;
a p-side electrode formed on the p-type semiconductor layer; and
an n-side electrode formed on the n-type semiconductor layer or on the conductive substrate, wherein
the n-side electrode extends in a region within 100 μm from each side of the substrate to a center along the side of the substrate, and has a predetermined length with respect to an entire peripheral length of the conductive substrate, and
the predetermined length ranges from 35% to 50% of the entire peripheral length of the conductive substrate.

2. The semiconductor light emitting element of claim 1, wherein the n-side electrode is formed on a part of the conductive substrate including the corner portion of the conductive substrate.

3. The semiconductor light emitting element of claim 1, wherein the n-side electrode includes a pad region for forming a bump.

4. The semiconductor light emitting element of claim 3, wherein the pad region is disposed in a central portion of a top surface of the n-side electrode.

5. The semiconductor light emitting element of claim 1, wherein a plated bump is formed on the n-side electrode.

6. The semiconductor light emitting element of claim 5, wherein a plated bump is formed on the p-side electrode.

7. A semiconductor light emitting device using the semiconductor light emitting element of claim 1.

* * * * *